(12) United States Patent
Kung et al.

(10) Patent No.: US 11,610,981 B2
(45) Date of Patent: Mar. 21, 2023

(54) METHOD FOR MANUFACTURING SEMICONDUCTOR DEVICE

(71) Applicant: Shanghai Huali Integrated Circuit Corporation, Shanghai (CN)

(72) Inventors: Changhung Kung, Shanghai (CN); Xiantao Li, Shanghai (CN); Xiumei Hu, Shanghai (CN); Jianxun Chen, Shanghai (CN); Chanyuan Hu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 31 days.

(21) Appl. No.: 17/224,406

(22) Filed: Apr. 7, 2021

(65) Prior Publication Data

US 2021/0408268 A1    Dec. 30, 2021

(30) Foreign Application Priority Data

Jun. 30, 2020  (CN) .......................... 202010621801.5

(51) Int. Cl.
| | |
|---|---|
| *H01L 29/66* | (2006.01) |
| *H01L 21/02* | (2006.01) |
| *H01L 21/3105* | (2006.01) |
| *H01L 21/311* | (2006.01) |
| *H01L 29/40* | (2006.01) |

(52) U.S. Cl.
CPC .. *H01L 29/66795* (2013.01); *H01L 21/02164* (2013.01); *H01L 21/02238* (2013.01); *H01L 21/02269* (2013.01); *H01L 21/02274* (2013.01); *H01L 21/31053* (2013.01); *H01L 21/31111* (2013.01); *H01L 29/401* (2013.01)

(58) Field of Classification Search
CPC ......... H01L 29/66795; H01L 21/02164; H01L 21/02238; H01L 21/02269; H01L 21/02274; H01L 21/31053; H01L 21/31111; H01L 29/401
See application file for complete search history.

(56) References Cited

U.S. PATENT DOCUMENTS

| | | | |
|---|---|---|---|
| 2015/0200111 A1* | 7/2015 | Muralidharan ... | H01L 21/32115 438/482 |
| 2020/0105605 A1* | 4/2020 | Teng ................... | H01L 29/7853 |

* cited by examiner

*Primary Examiner* — Monica D Harrison
*Assistant Examiner* — Andre C Stevenson
(74) *Attorney, Agent, or Firm* — Banner & Witcoff, Ltd.

(57) ABSTRACT

A method for manufacturing a semiconductor device comprising: providing a substrate, wherein an amorphous silicon layer is formed on the substrate; forming an etching auxiliary layer on the amorphous silicon layer, wherein the upper surface of the etching auxiliary layer is flat, and the etching auxiliary layer is made of a single material; and etching the amorphous silicon layer and the etching auxiliary layer to obtain an amorphous silicon layer with a target thickness, wherein the upper surface of the etched amorphous silicon layer is flat.

11 Claims, 4 Drawing Sheets

METHOD FOR MANUFACTURING SEMICONDUCTOR DEVICE

CROSS-REFERENCES TO RELATED APPLICATIONS

This application claims priority to Chinese patent application No. 202010621801.5, filed on Jun. 30, 2020, the disclosure of which is incorporated herein by reference in entirety.

TECHNICAL FIELD

The present application relates to the field of semiconductor device manufacturing, in particular to formation of an amorphous silicon gate of a fin field-effect transistor.

BACKGROUND

Since the early day when Dr. Jack Kilby of Texas Instruments invented the integrated circuit, scientists and engineers have made numerous inventions and improvements in the aspects of semiconductor device and process. The size of semiconductors has been significantly reduced in the past 50 years, leading to a continuous increase in the processing speed and a continuous reduction in the power consumption. So far, the development of semiconductors generally follows the Moore's Law. The Moore's Law generally indicates that the number of transistors in a dense integrated circuit doubles approximately every two years. Currently, the semiconductor process is developing towards a node below 20 nm, and some companies are working on the 14-nm process. A reference is provided herein, wherein the diameter of a silicon atom is about 0.2 nm, which means that the distance between two independent components manufactured by means of the 20-nm process is only about the sum of the diameters of a hundred silicon atoms. Therefore, the manufacturing of semiconductor devices becomes increasingly challenging and develops towards the feasible physical limit.

With the development of the integrated circuit, the device size becomes increasingly small, and the integration level becomes increasingly high. The structure of semiconductor devices gradually develops from the planar structure to the three-dimensional structure. In this context, the fin field-effect transistor comes into being. In the fin field-effect transistor, a fin channel structure is provided to effectively compensate for the degradation of device performance caused by the short-channel effect.

In the current advanced logic chip fin field-effect transistor process, the gate thickness control is a key element of electrical properties. The current process has developed to the stage of forming the gate of the fin field-effect transistor by using amorphous silicon. The process of forming a mixed layer of the amorphous silicon gate is complicated, and the isotropic etching that finally defines the height of the amorphous silicon gate requires the removal of films of three different materials, resulting in a relatively large difficulty in controlling the etching process and the loading effect. If the load in a chip is excessively large, an electrical mismatch of a device may occur, or deviation from a design target may occur, resulting in a test failure, and thereby imposing an impact on the product yield.

In view the above, there is an urgent need for a method for manufacturing a semiconductor device, to simplify the process of planarizing the surface of the amorphous silicon layer and effectively control the thickness of the amorphous silicon layer, thereby providing the possibility of forming a fin field-effect transistor with excellent device performance.

BRIEF SUMMARY

A brief overview of one or more aspects is provided below to provide a basic understanding of these aspects. The overview is not a detailed and comprehensive overview of all the conceived aspects, and is neither intended to identify the key or decisive elements of all the aspects, nor is it attempt to define the scope of any or all of the aspects. The sole purpose is to present some concepts of one or more aspects in a simplified form as a prelude to the more detailed description provided subsequently.

In order to solve the problem in the prior art, one aspect of the present application provides a method for manufacturing a semiconductor device, specifically comprising steps of:

providing a substrate, wherein an amorphous silicon layer is formed on the substrate;

forming an etching auxiliary layer on the amorphous silicon layer, wherein the upper surface of the etching auxiliary layer is flat, and the etching auxiliary layer is made of a single material; and etching the amorphous silicon layer and the etching auxiliary layer to obtain an amorphous silicon layer with a target thickness, wherein the upper surface of the etched amorphous silicon layer is flat.

In the above embodiment, by forming the etching auxiliary layer with a flat upper surface, the morphology of the etching auxiliary layer can be maintained in the etched amorphous silicon layer, so that the upper surface of the etched amorphous silicon layer is flat. By forming the etching auxiliary layer made of a single material, an entire etching process of etching a stacked layer composed of the etching auxiliary layer and the amorphous silicon layer is easier to be controlled, thereby obtaining an amorphous silicon layer with a target thickness and a flat upper surface.

In an embodiment of the manufacturing method, optionally, forming the etching auxiliary layer comprises steps of:

sequentially forming a first layer and a second layer on the amorphous silicon layer;

planarizing the upper surface of the second layer by using the first layer as a stop layer; and converting the material of the first layer into the material of the second layer.

In an embodiment of the manufacturing method, optionally, the first layer is a silicon buffer layer, and the second layer is a silicon oxide layer.

In an embodiment of the manufacturing method, optionally, high-temperature oxidation is performed on the silicon buffer layer to convert the silicon buffer layer into a silicon oxide layer.

In an embodiment of the manufacturing method, optionally, a temperature range of the high-temperature oxidation is 500-1100° C.

In an embodiment of the manufacturing method, optionally, the temperature range of the high-temperature oxidation is 800-900° C.

In an embodiment of the manufacturing method, optionally, the silicon buffer layer is formed by means of furnace tube thermal reaction deposition.

In an embodiment of the manufacturing method, optionally, the silicon oxide layer is deposited by means of a high density plasma or high aspect ratio process or a plasma enhanced technique.

In an embodiment of the manufacturing method, optionally, a reagent having a selection ratio with respect to the first layer and the second layer is used to planarize the second layer by means of chemical-mechanical polish.

In an embodiment of the manufacturing method, optionally, the thickness of the first layer is 10-30 angstroms.

In an embodiment of the manufacturing method, optionally, the thickness of the second layer is 350-2000 angstroms.

In an embodiment of the manufacturing method, optionally, the etching is isotropic etching.

According to the method for manufacturing a semiconductor device provided by the present application, the flatness of the surface of the amorphous silicon layer can be effectively improved via a simple technological process and the thickness of the amorphous silicon layer can be effectively and accurately controlled, thereby providing the possibility of forming a fin field-effect transistor with excellent device performance.

BRIEF DESCRIPTION OF THE DRAWINGS

By reading the detailed description of the embodiments of the present disclosure with reference to the following drawings, one can better understand the above-mentioned features and advantages of the present application. In the drawings, various components are not necessarily drawn to scale, and components with similar related characteristics or features may have the same or similar reference numerals.

DETAILED DESCRIPTION OF THE DISCLOSURE

Figure 1:
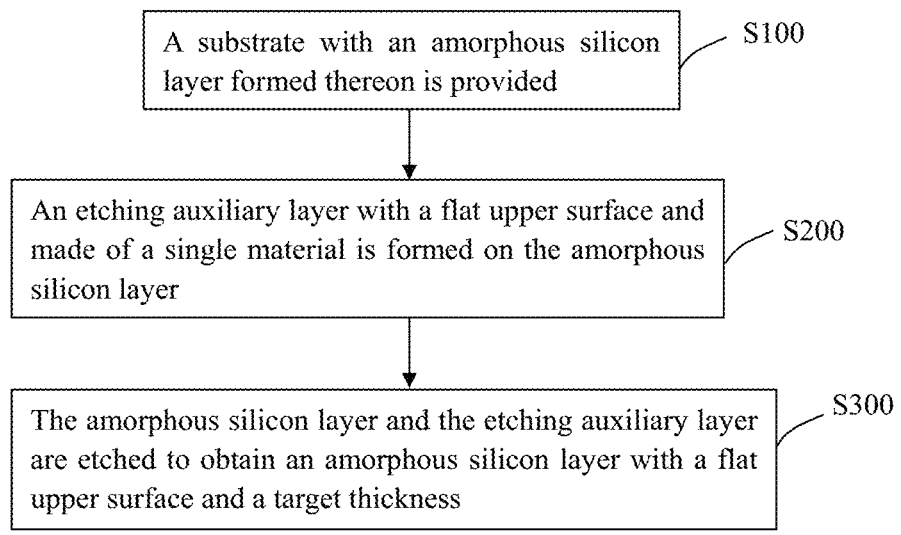
FIG. 1 illustrates a flowchart of a manufacturing method provided in one aspect of the present application.

The present application is described in detail below with reference to the drawings and specific embodiments. It should be noted that the following aspects described with reference to the drawings and specific embodiments are merely some examples and should not be construed as any limitation on the protection scope of the present application.

The present application relates to a semiconductor device manufacturing process. According to the method for manufacturing a semiconductor device provided by the present application, the flatness of the surface of the amorphous silicon layer can be effectively improved via a simple technological process and the thickness of the amorphous silicon layer can be effectively and accurately controlled, thereby providing the possibility of forming a fin field-effect transistor with excellent device performance.

The following description is provided to enable those skilled in the art to implement and use the present application and incorporate it into specific application contexts. Various modifications and various uses in different applications are apparent to those skilled in the art, and the general principles defined herein can be applied to a wide range of embodiments. Therefore, the present application is not limited to the embodiments provided herein, but should be granted the broadest scope consistent with the principles and novel features disclosed herein.

In the following detailed description, many specific details are set forth to provide a more thorough understanding of the present application. However, it is obvious to those skilled in the art that the practice of the present application may not necessarily be limited to these specific details. In other words, the well-known structures and devices are shown in block diagram forms and are not shown in detail, so as to avoid obscuring the present application.

Readers should be noted that all files and documents submitted with this specification and open to the public to consult this specification, and the contents of all of the files and documents are incorporated herein by reference. Unless otherwise stated directly, all the features disclosed in this specification (including any appended claims, abstract, and drawings) can be replaced by alternative features for achieving the same, equivalent, or similar purpose. Therefore, unless otherwise stated expressly, each feature disclosed is only an example of a set of equivalent or similar features.

It should be noted that when used, the left, right, front, rear, top, bottom, head, tail, clockwise, and counterclockwise signs are used for convenience only, and do not imply any specific direction. In fact, they are used to reflect the relative position and/or orientation between various parts of an object.

As used herein, the terms "over", "under", "between", and "on" refer to a relative position of one layer relative to another layer. Likewise, for example, a layer deposited or placed over or under another layer may directly contact the other layer or may be separated from the other layer by one or more intermediate layers. Moreover, a layer deposited or placed between layers may directly contact the layers or may be separated from the layers by one or more intermediate layers. In contrast, a first layer "on" a second layer is in contact with the second layer. In addition, a relative position of one layer relative to the other layers is provided (assuming that deposition, modification, and film removal operations are performed relative to a base substrate, regardless of the absolute orientation of the substrate).

As stated above, in order to effectively improve the flatness of the surface of an amorphous silicon layer via a simple technological process and effectively and accurately control the thickness of the amorphous silicon layer, the present application provides a method for manufacturing a semiconductor device. Referring to FIG. 1, the manufacturing method provided by the present application includes: step S100: a substrate with an amorphous silicon layer formed thereon is provided; step S200: an etching auxiliary layer with a flat upper surface and made of a single material is formed on the amorphous silicon layer; and step S300: the amorphous silicon layer and the etching auxiliary layer are etched to obtain an amorphous silicon layer with a flat upper surface and a target thickness.

In the above embodiment, the amorphous silicon layer is used to form a gate structure of the fin field-effect transistor. It can be understood that, for the substrate with the amorphous silicon layer formed thereon in step S100, structures such as a gate dielectric layer and a fin channel can be formed between the substrate and the amorphous silicon layer according to various requirements of the formed fin field-effect transistor, which are not mentioned in the present application, but it does not indicate that the structures do not actually exist.

Amorphous silicon (α-Si) is a form of monatomic silicon. The amorphous silicon is a direct energy band semiconductor, the structure of which includes many so-called "dangling bonds" therein, i.e., electrons that do not bond with surrounding silicon atoms. These electrons can generate an electric current under the action of an electric field, without the need for phonons.

Due to the amorphism of the amorphous silicon, it is difficult to accurately control etching and film thickness of the amorphous silicon via a simple technological process. In the above embodiment, by forming the etching auxiliary layer with a flat upper surface and made of a single material on the amorphous silicon layer, the etching of the amorphous silicon layer can be accurately controlled during a subsequent process of etching the amorphous silicon layer, so that the etched amorphous silicon layer has a flat upper surface and a target thickness.

Specifically, in step S200, forming the etching auxiliary layer with a flat upper surface and made of a single material includes steps of: sequentially forming a first layer and a second layer on the amorphous silicon layer; planarizing the upper surface of the second layer by using the first layer as a stop layer; and converting the material of the first layer into the material of the second layer.

Since the etching auxiliary layer with a flat upper surface is required, the upper surface of the etching auxiliary layer needs to be planarized. Therefore, in order to accurately control the planarization treatment on the upper surface of the etching auxiliary layer, the etching auxiliary layer can be formed by means of two materials with an etching selection ratio, so that the upper surface of the second layer can be planarized by using the first layer under the second layer as a stop layer.

It can be understood that in the prior art, there are various combinations of two materials with an etching selection ratio. However, if the formed etching auxiliary layer is made of two materials, in a subsequent process of etching the amorphous silicon layer, etching of three materials needs to be controlled synchronously, thereby imposing very high requirements on the etching of the amorphous silicon layer. Therefore, it is expected that the first layer and the second layer can be converted into the same material after the second layer is planarized, so as to provide an etching auxiliary layer made of a single material, thereby facilitating the subsequent accurate control of the etching of the amorphous silicon layer.

In the above embodiment, in some examples, the first layer is a silicon buffer layer, and the second layer is a silicon oxide layer. It can be understood that the silicon buffer layer can be used as an etching stop layer for the silicon oxide layer during the planarization process. In addition, the silicon buffer layer can be qualitatively changed into a silicon oxide layer by means of high-temperature oxidation, so that the first layer and the second layer are made of the same material.

In the above embodiment, a precursor disilane ($Si_2H_6$) can be used to form the silicon buffer layer by means of a furnace tube thermal reaction. In some examples, the thickness of the silicon buffer layer is 10-30 angstroms. The silicon oxide layer can be deposited and formed by means of a high density plasma (HDP) or high aspect ratio process (HARP) or a plasma enhanced (PE) technique. In some examples, the thickness of the silicon oxide layer is 350-2000 angstroms.

In a process of planarizing the silicon oxide layer by using the silicon buffer layer as a stop layer, a reagent having a selection ratio with respect to the silicon buffer layer and the silicon oxide layer can be used to planarize the silicon oxide layer by means of chemical-mechanical polish (CMP).

In a process of qualitatively change the silicon buffer layer to a silicon oxide layer, the silicon buffer layer can be qualitatively changed to a silicon oxide layer by means of high-temperature tempering. Specific conditions for high-temperature tempering oxidation are oxygen and a high temperature between 500-1100° C. In consideration of costs, in some examples, the temperature of the high-temperature tempering oxidation is between 800-900° C.

After the silicon buffer layer is qualitatively changed to a silicon oxide layer, the auxiliary etching layer with a flat upper surface and made of a single silicon oxide material is formed. Therefore, in step S300, the amorphous silicon layer and the etching auxiliary layer made of silicon oxide can be etched by means of isotropic etching. As a result, the morphology of the upper surface of the etching auxiliary layer is maintained on the upper surface of the etched amorphous silicon layer, and since only the etching of two materials of the amorphous silicon layer and the silicon oxide layer needs to be controlled synchronously, the thickness of the amorphous silicon layer can be accurately controlled.

According to the method for manufacturing a semiconductor device provided by the present application, the flatness of the surface of the amorphous silicon layer can be effectively improved via a simple technological process and the thickness of the amorphous silicon layer can be effectively and accurately controlled, thereby providing the possibility of forming a fin field-effect transistor with excellent device performance.

Reference is made to FIGS. 2A-2D and FIGS. 3A-3E to understand the manufacturing method provided by the present application. FIGS. 2A-2D illustrate schematic structural diagrams in various steps of a related process in the prior art, and FIGS. 3A-3E illustrate structural schematic diagrams in various steps of the manufacturing method provided by the present application.

Figure 2A:
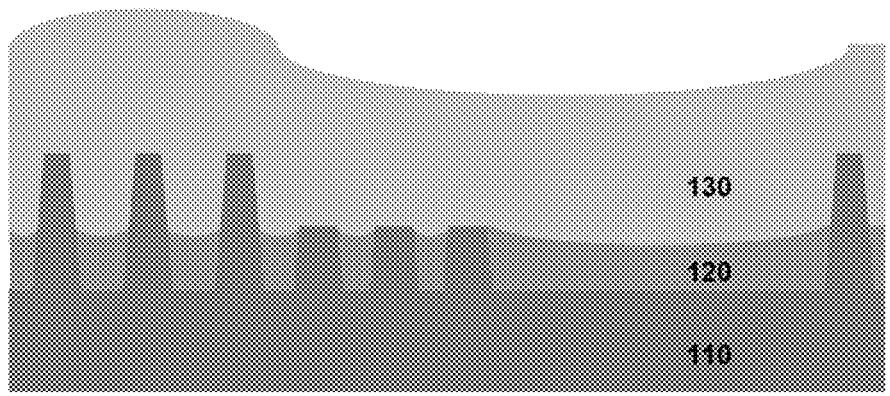
FIGS. 2A-2D illustrate schematic structural diagrams in an amorphous silicon layer etching process in the prior art.
Figure 2B:
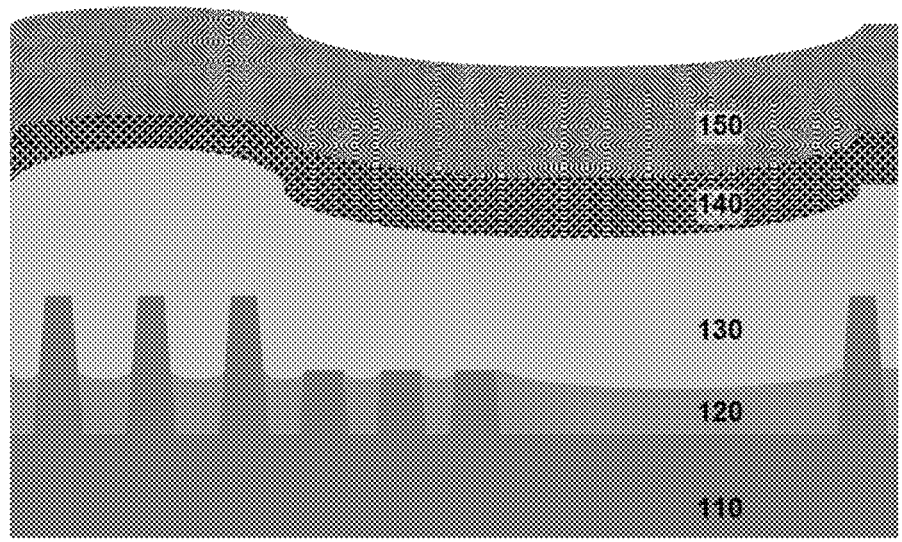

First, reference is made to FIGS. 2A-2D to understand the problem existing in the prior art. Referring to FIG. 2A, the related process in the prior art is based on the device structure shown in FIG. 2A, that is, a substrate 110 is provided, wherein an amorphous silicon layer 130 to be etched is formed on the substrate 110. A gate dielectric layer 120 can be provided between the substrate 110 and the amorphous silicon layer 130.

Due to the amorphism of amorphous silicon, it is difficult to accurately control etching and film thickness of the amorphous silicon via a simple technological process. In the prior art, referring to FIG. 2B, in order to accurately control the etching and film thickness of the amorphous silicon, a silicon nitride layer 140 and a silicon oxide layer 150 need to be sequentially formed on the upper surface of the amorphous silicon layer 130. The silicon nitride layer 140 can be used as a polishing stop layer for the silicon oxide layer 150 in a chemical-mechanical polish process with a selection ratio, so as to remove the top of the silicon oxide layer 150 to obtain a structure with a flat upper surface, referring to FIG. 2C.

Figure 2C:
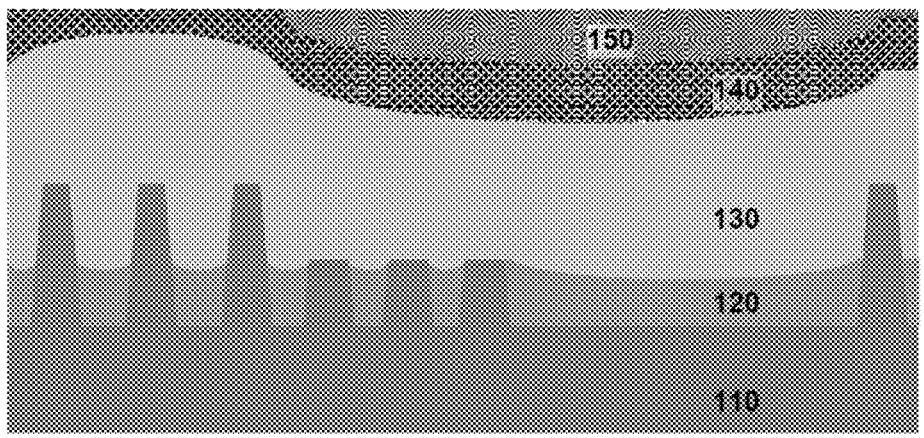
Figure 2D:
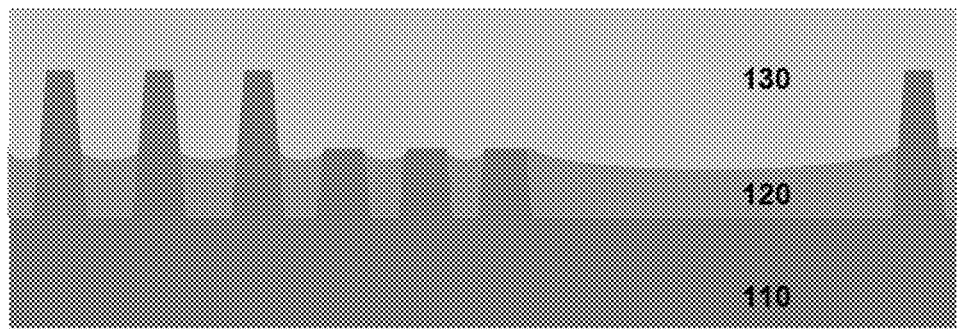

In the prior art, after the structure shown in FIG. 2C is obtained, a mixed layer structure of the silicon oxide layer 150/silicon nitride layer 140/amorphous silicon layer 130 is etched by means of isotropic etching, to obtain an amorphous silicon layer with a flat upper surface and a target thickness by means of etching. However, the etching of three materials of the silicon oxide layer 150/silicon nitride layer 140/amorphous silicon layer 130 needs to be controlled synchronously, resulting in a relatively large difficulty in controlling an etching process and a loading effect. Therefore, in the manufacturing method provided by the present application, it is expected that the accurate control of the etching of the amorphous silicon layer can be implemented via a simple technological process, so as to reduce the difficulty in controlling the etching process and the loading effect.

Figure 3A:
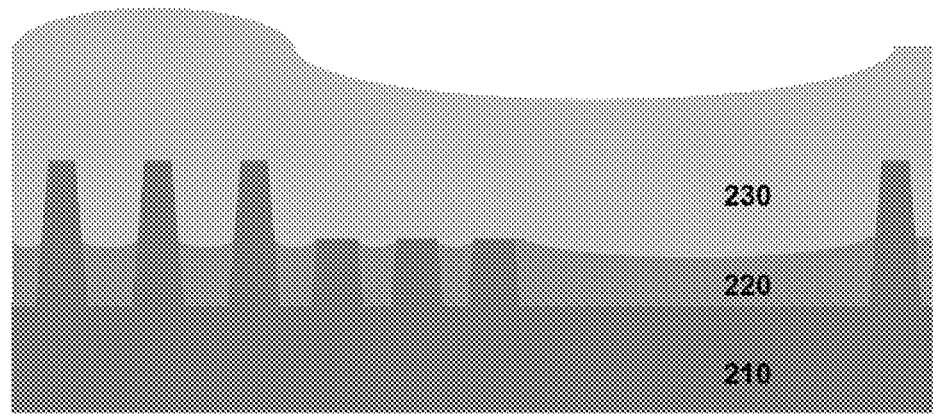
FIGS. 3A-3E illustrate schematic structural diagrams in an amorphous silicon layer etching process in the manufacturing method provided by the present application.

Further, reference is made to FIGS. 3A-3E to understand the improved process provided by the present application. First, FIG. 3A illustrates a schematic structural diagram obtained after a substrate is provided. Similar to FIG. 2A, a substrate 210 is provided, wherein an amorphous silicon layer 230 to be etched is formed on the substrate 210.

As described above, in an embodiment, the semiconductor device processed by the manufacturing method provided by the present application is a fin field-effect transistor. Therefore, the amorphous silicon layer 230 is etched to form a gate of the fin field-effect transistor. It can be understood that, in order to implement functions of the fin field-effect transistor, a gate dielectric layer 220 and a fin channel of the fin field-effect transistor can be formed between the substrate 210 and the amorphous silicon layer 230. The gate dielectric layer 220 can be made of an existing or future gate dielectric material, including but not limited to a silicon oxide or high dielectric constant material. The gate dielectric layer 220 made of silicon oxide can be formed by means of flowable chemical vapor deposition (FCVD). It should be noted that other structures of the fin field-effect transistor and methods for forming the same should not unduly limit the protection scope of the present application.

As an improvement, in order to accurately control the etching of the amorphous silicon layer 230, in the present application, an etching auxiliary layer with a flat upper surface and made of a single material is formed on the amorphous silicon layer 230. In order to form the etching auxiliary layer with a flat upper surface and made of a single material, in the manufacturing method provided by the present application, a first layer 240 and a second layer 250 are sequentially formed over the amorphous silicon layer 230, referring to FIG. 3B.

Since the etching auxiliary layer with a flat upper surface is required, the upper surface of the etching auxiliary layer needs to be planarized. Therefore, in order to accurately control the planarization treatment on the upper surface of the etching auxiliary layer, the etching auxiliary layer can be formed by means of two materials with an etching selection ratio, so that the upper surface of the second layer 250 can be planarized by using the first layer 240 under the second layer as a stop layer.

It can be understood that in the prior art, there are various combinations of two materials with an etching selection ratio, for example, in the prior art shown in FIGS. 2A-2D, a combination of silicon nitride/silicon oxide is used. However, if the formed etching auxiliary layer is made of two materials, in a subsequent process of etching the amorphous silicon layer, etching of three materials needs to be controlled synchronously, thereby imposing very high requirements on the etching of the amorphous silicon layer. Therefore, it is expected that the first layer and the second layer can be converted into the same material after the second layer is planarized, so as to provide an etching auxiliary layer made of a single material, thereby facilitating the subsequent accurate control of the etching of the amorphous silicon layer.

Figure 3B:
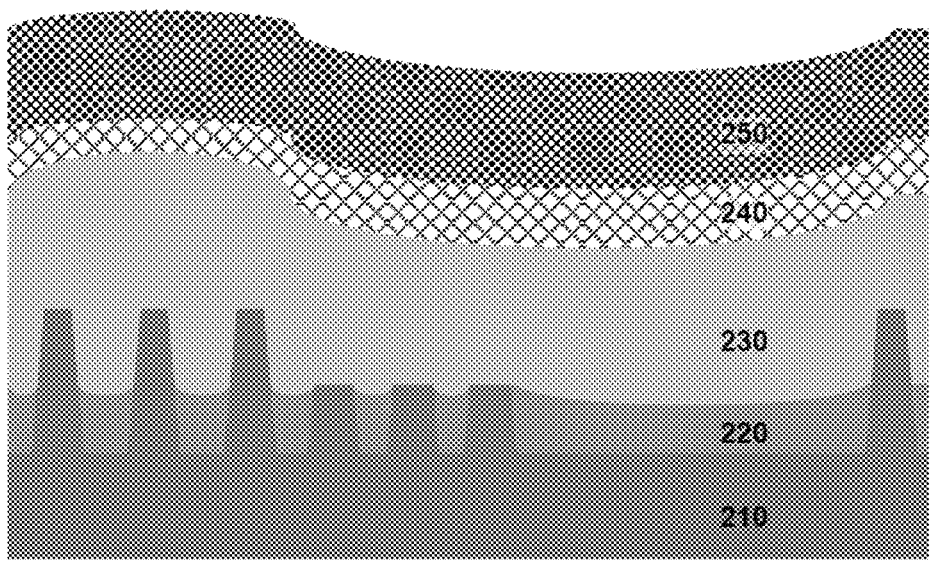

That is, in the structure shown in FIG. 3B, the material of the first layer 240 can be used as a stop layer for the second layer 250 during a process of performing the planarization treatment on the second layer 250, and the materials of the first layer 240 and the second layer 250 can be converted, so that the first layer 240 and the second layer 250 can be processed into an etching auxiliary layer made of a single material after the planarization treatment.

In the above embodiment, in some examples, the first layer 240 is a silicon buffer layer, and the second layer 250 is a silicon oxide layer. It can be understood that the silicon buffer layer can be used as an etching stop layer for the silicon oxide layer during the planarization process. In addition, the silicon buffer layer can be qualitatively changed into a silicon oxide layer by means of high-temperature oxidation, so that the first layer 240 and the second layer 250 are made of the same material.

Specifically, in order to form the first layer 240 made of silicon, a precursor disilane ($Si_2H_6$) can be used to form the silicon buffer layer by means of a furnace tube thermal reaction. In some examples, the thickness of the silicon buffer layer is 10-30 angstroms. In order to form the second layer 250 made of silicon oxide, the silicon oxide layer can be deposited and formed by means of a high density plasma (HDP) or high aspect ratio process (HARP) or a plasma enhanced (PE) technique. In some examples, the thickness of the silicon oxide layer is 350-2000 angstroms.

Figure 3C:
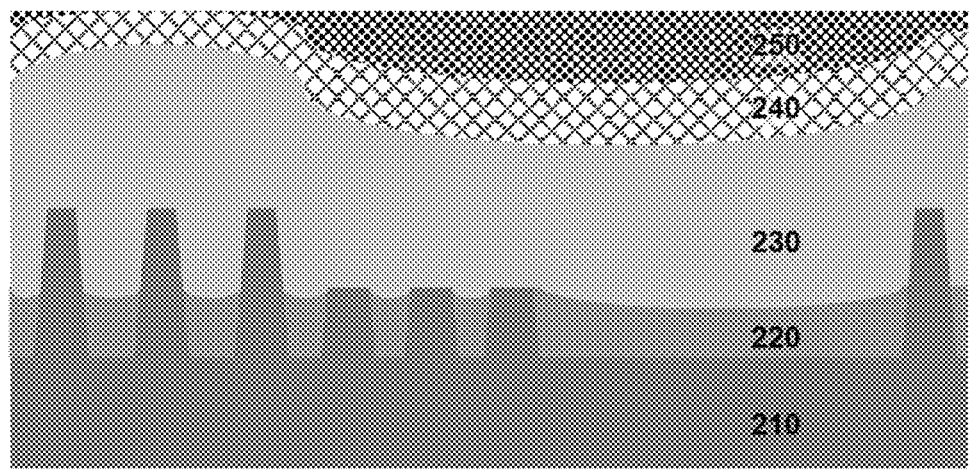

Subsequently, referring to FIG. 3C, the planarization treatment is performed on the second layer 250 and stops on the first layer 240 made of silicon. In an embodiment, a reagent having a selection ratio with respect to the silicon buffer layer and the silicon oxide layer can be used to planarize the silicon oxide layer by means of chemical-mechanical polish (CMP) with a selection ratio, so as to remove the top layer of the silicon oxide layer, wherein the polish stops on the silicon buffer layer.

As an improvement, the first layer 240 and second layer 250 made of different materials need to be converted into the same material. In an example embodiment, the first layer 240 made of silicon is qualitatively changed to a silicon oxide layer, thereby forming an etching auxiliary layer with a flat upper surface and made of a single material.

Figure 3D:
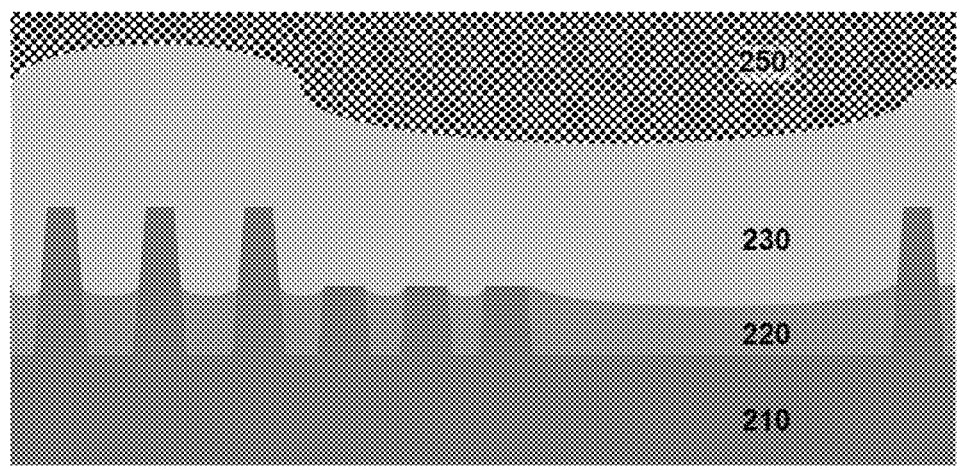
Figure 3E:
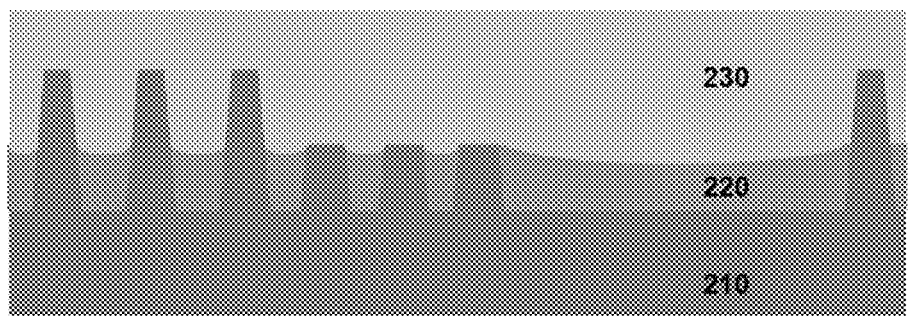

In a process of qualitatively change the silicon buffer layer to a silicon oxide layer, the silicon buffer layer can be qualitatively changed to a silicon oxide layer by means of high-temperature tempering. Specific conditions for high-temperature tempering oxidation are oxygen and a high temperature between 500-1100° C. In consideration of costs, in some examples, the temperature of the high-temperature tempering oxidation is between 800-900° C. Referring to FIG. 3D, the first layer made of silicon is qualitatively changed to the second layer 250 made of silicon oxide.

After the silicon buffer layer is qualitatively changed to a silicon oxide layer, the auxiliary etching layer with a flat upper surface and made of a single silicon oxide material is formed. Therefore, referring to FIG. 3E, the amorphous silicon layer and the etching auxiliary layer made of silicon oxide can be etched by means of isotropic etching. As a result, the morphology of the upper surface of the etching auxiliary layer is maintained on the upper surface of the etched amorphous silicon layer, and since only the etching of two materials of the amorphous silicon layer and the silicon oxide layer needs to be controlled synchronously, the thickness of the amorphous silicon layer can be accurately controlled.

According to the method for manufacturing a semiconductor device provided by the present application, the flatness of the surface of the amorphous silicon layer can be effectively improved via a simple technological process and the thickness of the amorphous silicon layer can be effectively and accurately controlled, thereby providing the possibility of forming a fin field-effect transistor with excellent device performance.

Although the present disclosure is described with respect to specific exemplary embodiments, it is obvious that various modifications and changes can be made to these embodiments without departing from the broader spirit and scope of the present disclosure. Therefore, the specification and drawings should be construed as being illustrative rather than restrictive.

It should be understood that this specification will not be used to interpret or limit the scope or meaning of the claims. In addition, in the foregoing detailed description, it can be seen that various features are combined together in a single embodiment for the purpose of simplifying the present disclosure. The method of the present disclosure should not be construed as reflecting that the claimed embodiments require more features than those explicitly listed in each claim. On the contrary, as reflected in the appended claims, the inventive subject matter includes features less than all the features of a single disclosed embodiment. Therefore, the appended claims are hereby incorporated into the detailed description, with each claim independently used as an independent embodiment.

An embodiment or embodiments mentioned in the description are intended to be included in at least one embodiment of a circuit or method in combination with the specific features, structures, or characteristics described in the embodiment. The phrase "one embodiment" in various portions of the specification does not necessarily refer to the same embodiment.

What is claimed is:

1. A method for manufacturing a semiconductor device, comprising:
    providing a substrate, wherein an amorphous silicon layer is formed on the substrate,
    forming an etching auxiliary layer on the amorphous silicon layer, wherein an upper surface of the etching auxiliary layer is flat, and the etching auxiliary layer is made of a single material; and
    etching the amorphous silicon layer and the etching auxiliary layer to obtain an amorphous silicon layer with a target thickness, wherein an upper surface of the etched amorphous silicon layer is flat,
    wherein the forming the etching auxiliary layer comprises:
    sequentially forming a first layer and a second layer on the amorphous silicon layer;
    planarizing the upper surface of the second layer by using the first layer as a stop layer; and
    converting a material of the first layer into a material of the second layer.

2. The method for manufacturing the semiconductor device according to claim 1, wherein the first layer is a silicon buffer layer, and the second layer is a silicon oxide layer.

3. The method for manufacturing the semiconductor device according to claim 2, wherein high-temperature oxidation is performed on the silicon buffer layer to convert the silicon buffer layer into a silicon oxide layer.

4. The method for manufacturing the semiconductor device according to claim 3, wherein a temperature range of the high-temperature oxidation is 500-1100° C.

5. The method for manufacturing the semiconductor device according to claim 4, wherein the temperature range of the high-temperature oxidation is 800-900° C.

6. The method for manufacturing the semiconductor device according to claim 2, wherein the silicon buffer layer is formed by means of furnace tube thermal reaction deposition.

7. The method for manufacturing the semiconductor device according to claim 2, wherein the silicon oxide layer is deposited by means of a high density plasma or high aspect ratio process or a plasma enhanced technique.

8. The method for manufacturing the semiconductor device according to claim 1, wherein a reagent having a selection ratio with respect to the first layer and the second layer is used to planarize the second layer by means of chemical-mechanical polish.

9. The method for manufacturing the semiconductor device according to claim 1, wherein a thickness of the first layer is 10-30 angstroms.

10. The method for manufacturing the semiconductor device according to claim 1, wherein a thickness of the second layer is 350-2000 angstroms.

11. The method for manufacturing the semiconductor device according to claim 1, wherein the etching is isotropic etching.

* * * * *